(12) United States Patent
Chadwick

(10) Patent No.: US 6,917,791 B2
(45) Date of Patent: *Jul. 12, 2005

(54) POLAR LOOP TRANSMITTER

(75) Inventor: Peter Edward Chadwick, Swindon (GB)

(73) Assignee: Zarlink Semiconductor Limited, Swindon (GB)

( * ) Notice: Subject to any disclaimer, the term of this patent is extended or adjusted under 35 U.S.C. 154(b) by 462 days.

This patent is subject to a terminal disclaimer.

(21) Appl. No.: 10/114,429

(22) Filed: Apr. 2, 2002

(65) Prior Publication Data

US 2002/0168950 A1 Nov. 14, 2002

(30) Foreign Application Priority Data

Apr. 12, 2001 (GB) ............................................ 0109265

(51) Int. Cl.$^7$ .............................................. H01Q 11/12
(52) U.S. Cl. .......................... 455/126; 455/108; 455/91
(58) Field of Search ................................. 455/91, 114.2, 455/126, 108, 118, 102, 127.1; 332/117, 126, 144, 145, 162

(56) References Cited

U.S. PATENT DOCUMENTS

| | | | |
|---|---|---|---|
| 4,481,672 A | * 11/1984 | Watkinson | 455/108 |
| 4,618,999 A | * 10/1986 | Watkinson | 455/108 |
| 4,630,315 A | * 12/1986 | Watkinson | 455/109 |
| 2002/0090921 A1 | * 7/2002 | Midtgaard et al. | 455/126 |
| 2003/0067994 A1 | * 4/2003 | Chadwick | 375/295 |
| 2003/0073419 A1 | * 4/2003 | Chadwick | 455/126 |
| 2003/0109240 A1 | * 6/2003 | Zipper | 455/323 |

FOREIGN PATENT DOCUMENTS

| | | | |
|---|---|---|---|
| GB | 2 135 546 A | 8/1984 | |
| GB | 0109265.9 | 5/2001 | |
| GB | 2370 435 A | * 6/2002 | ............ H04B/1/04 |

OTHER PUBLICATIONS

Gosling and Petrovic, Electronics Letters, 1979, 15(10) pp 286–288.
Kahn, Single Sideband Transmission by Envelope Elimination and Restoration, Proc. IRE 1952, 40, pp 803–806.

* cited by examiner

Primary Examiner—Sonny Trinh
(74) Attorney, Agent, or Firm—Dority & Manning, P.A.

(57) ABSTRACT

A polar loop transmitter circuit arrangement includes a circuit input, a circuit output and a controllable signal source. A modulator is coupled between the signal source and the output, whilst a first logarithmic amplifier is provided having its input coupled to the circuit input. A second logarithmic amplifier is also provided having its output coupled to the circuit output. An output of each logarithmic amplifier is coupled to a respective input of a comparator, and an output of the comparator is coupled to an input of the modulator. The logarithmic amplifiers can be successive detection logarithmic amplifiers, such amplifiers having an RF output which is amplitude limited and can be designed to have constant phase limited output.

8 Claims, 3 Drawing Sheets

POLAR LOOP TRANSMITTER

CROSS-REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates to a polar loop transmitter.

The polar loop transmitter was first described by Gosling and Petrovic in Electronics Letters, 1979, 15(10) pp 286–288. This was a development of the work of Kahn "Single Sideband Transmission by Envelope Elimination and Restoration", Proc. IRE 1952, 40, pp 803–806. The basic scheme of the polar loop transmitter is shown in FIG. 1.

Referring to FIG. 1, the transmitter 100 comprises generally an RF input 101 to which is applied in use an input signal, and a voltage controlled oscillator (VCO) 102. A signal output of the VCO 102 is fed via a controllable gain amplifier 104 to an RF output 103, to provide a modulated RF output signal. The RF input 101 is connected both to a first amplitude detector 105 and to a first limiting amplifier 106. Similarly, the RF output 103 is connected both to a second amplitude detector 107 and to a second limiting amplifier 108. This arrangement, therefore, separates both input signals and output signals into amplitude and phase components.

The outputs of the limiting amplifiers 106, 108 are connected to respective inputs of a phase comparator 109, which generates a signal on its output which is proportional to the difference in phase between the input signal and the output signal. The output of the phase comparator 109 is connected to a control input of the VCO 102, via a low-pass filter 110, to control the phase of the signal generated by the VCO in order to minimize the phase difference. This arrangement thus constitutes a phase locked loop. Instead of being coupled to the output of the amplifier 104, the input of the limiting amplifier 108 may be coupled directly to the output of the VCO 102. This variant is not so beneficial since there is no compensation of amplitude to phase variations introduced in the amplifier 104. Outputs of the amplitude detectors 105 and 107 are connected to respective inputs of a comparator 111, which provides a signal on its output dependent on the difference in the instantaneous amplitudes of the input and output signals. The output of the comparator 111 is connected to a gain control input of the controllable amplifier 104, via a second low-pass filter 112. The controllable gain amplifier 104 is, therefore, caused to modulate the output of the VCO 102 so that its amplitude follows variations in the amplitude of the input signal.

The polar loop transmitter 100 suffers certain disadvantages when the variation in input signal amplitude is large, namely that any phase modulation to amplitude modulation conversion caused by the limiting amplifiers 106 and 108 add unwanted phase modulation to the output signal as the amplitude of the input signal varies. In addition, with large RF input signal variations, the difference between the signals at the inputs of the comparator 111 becomes small when the output signal is small, increasing distortion at low instantaneous signal levels. These problems were discussed by Petrovic and Kaya in their paper "Spurious Emissions from EER Type Transmitters", ISBN 0903748630, pp 181–8. Furthermore, any distortion introduced by the amplitude detectors 105 and 107 appears in the output signal. To minimize this latter effect, it is desirable to control carefully the amplitudes of the signals provided to the amplitude detectors 105 and 107.

OBJECTS AND SUMMARY OF THE INVENTION

According to this invention, there is provided a polar loop transmitter circuit arrangement comprising: a circuit input; a circuit output; a controllable signal source; a modulator coupled between the signal source and the output; a first logarithmic amplifier having its input coupled to the circuit input; a second logarithmic amplifier having its output coupled to the circuit output; an output of each logarithmic amplifier being coupled to a respective input of a comparator, and an output of the comparator being coupled to an input of the modulator.

Features of preferred embodiments of the invention are set out in the dependent claims.

An embodiment of this invention will now be described, by way of example only, with reference to the accompanying drawings.

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and description.

Figure 1:
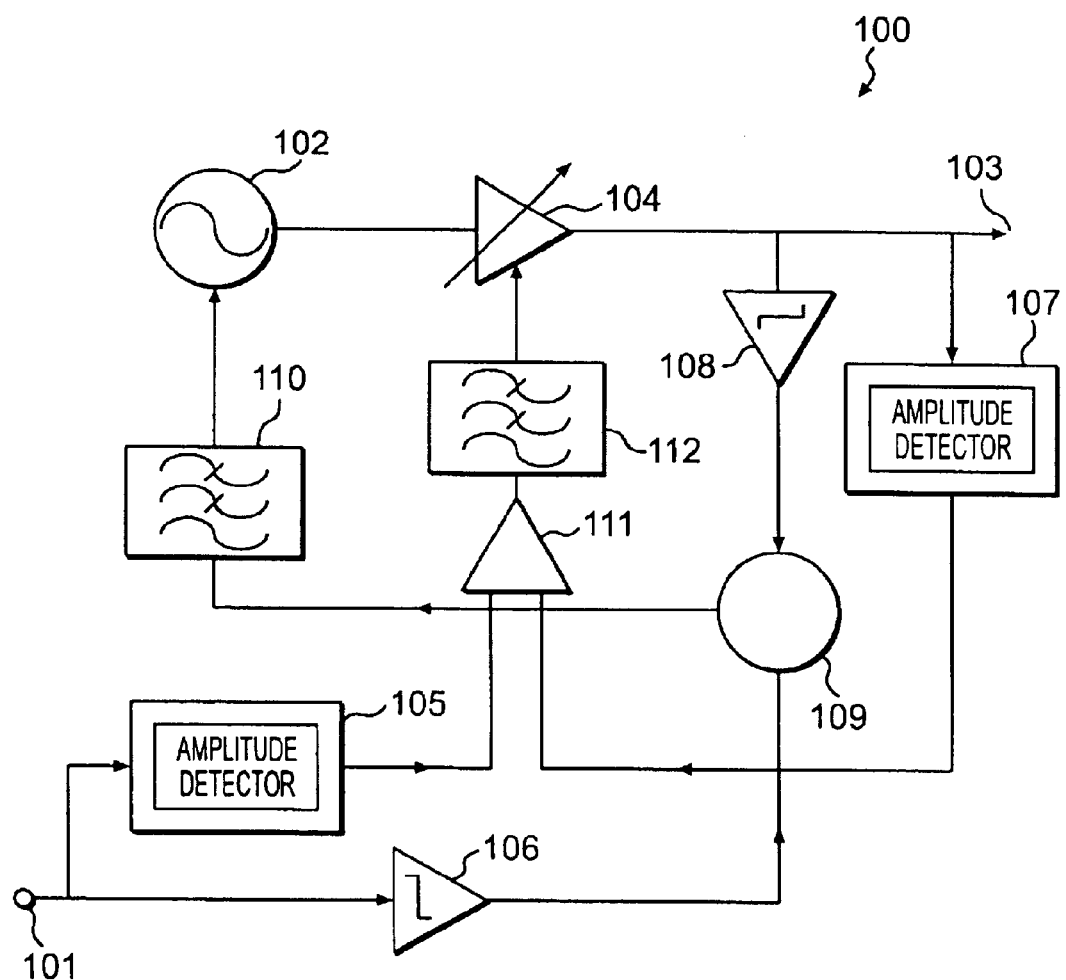
FIG. 1 is a schematic diagram of a prior art polar loop transmitter circuit arrangement.
Figure 2:
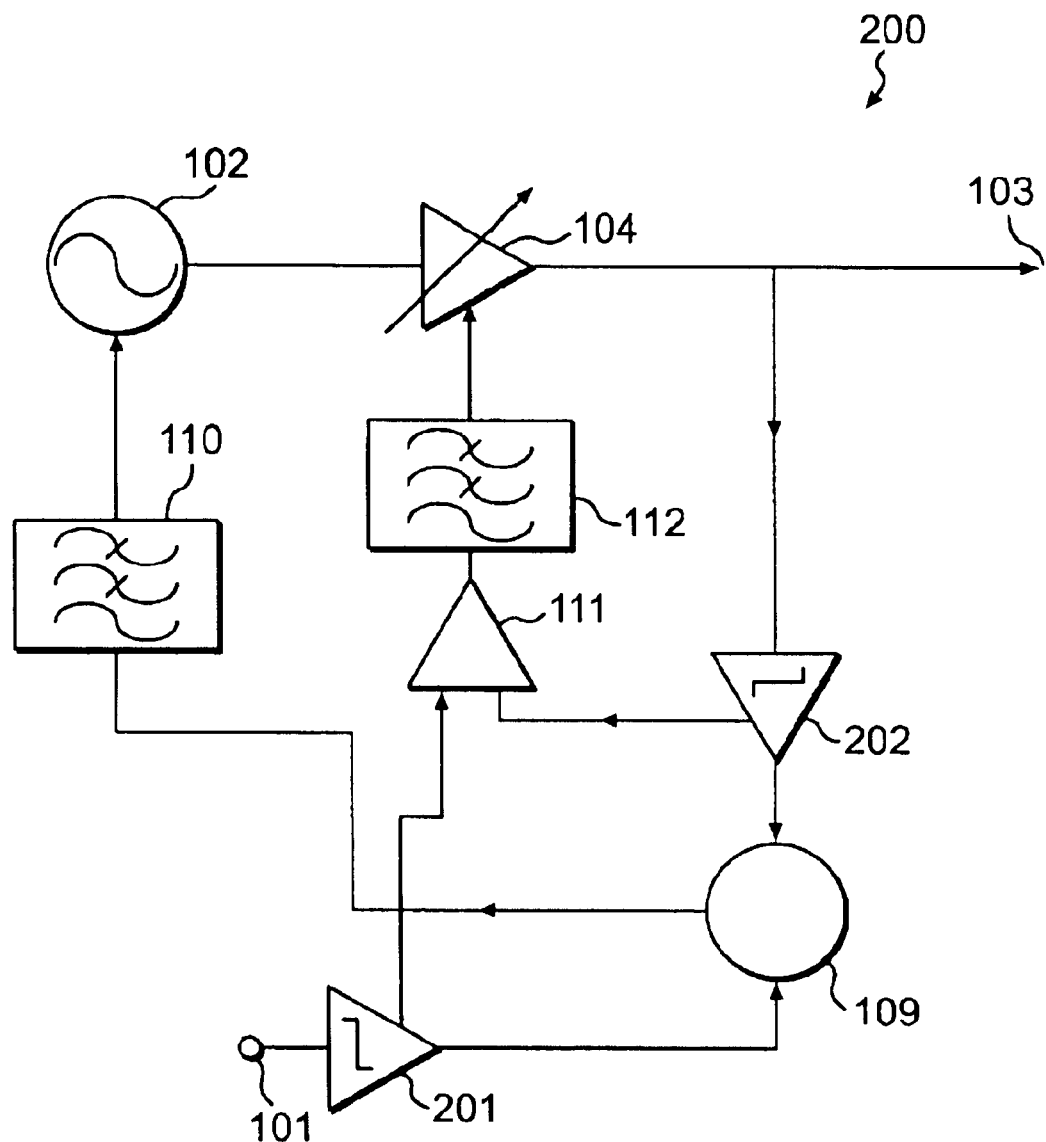
FIGS. 2 and 3 are schematic diagrams of polar loop transmitter circuit arrangements in accordance with the invention.
Figure 3:
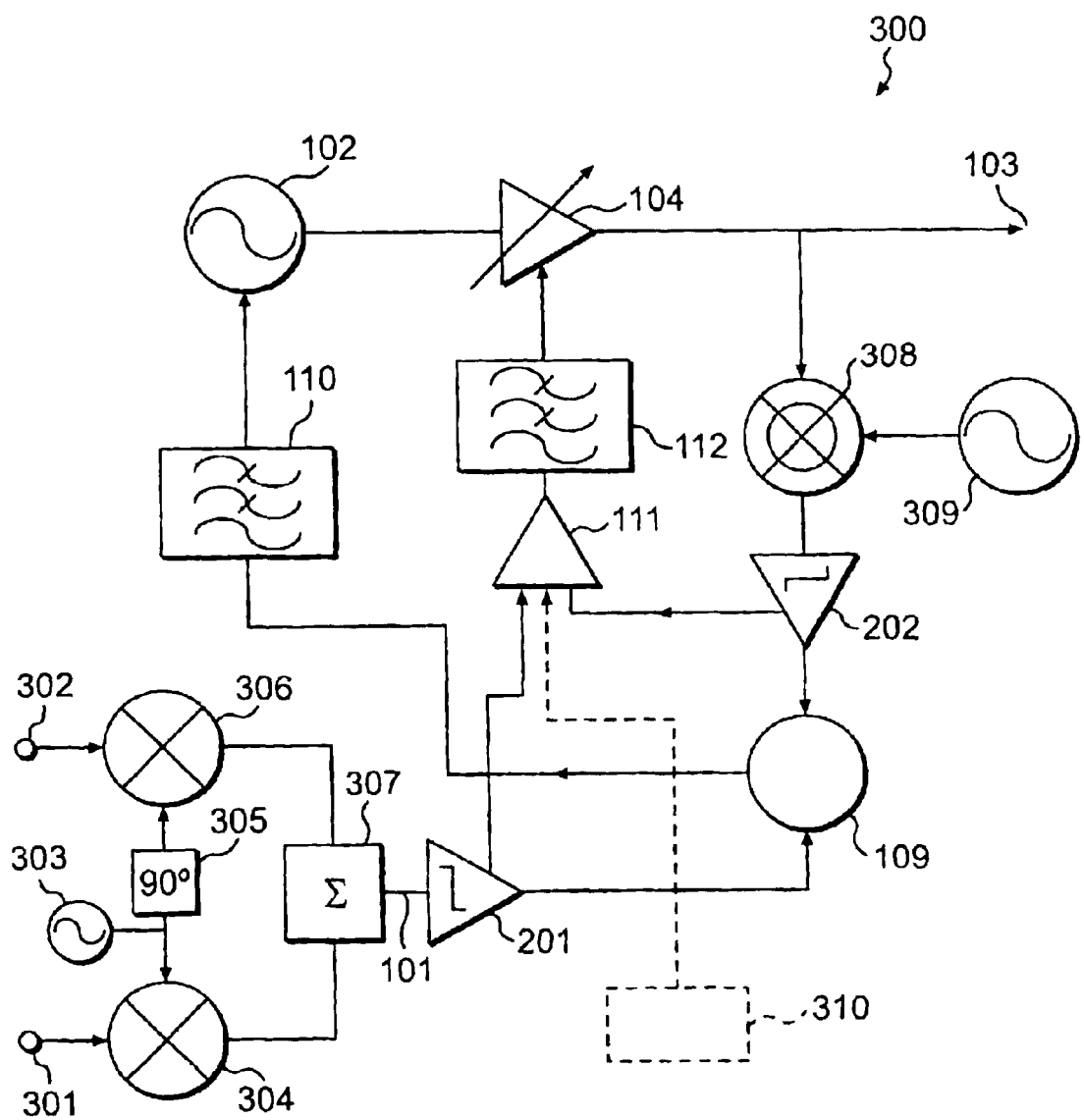

In FIGS. 2 and 3, certain reference numerals are the same as those used in FIG. 1, for like elements.

Referring to FIG. 2, a polar loop transmitter circuit arrangement 200 in accordance with the invention has, in place of the amplitude detectors 105, 107 and limiting amplifiers 106, 108 of the arrangement of FIG. 1, first and second logarithmic amplifiers 201 and 202. Each of the logarithmic amplifiers 201, 202 has two outputs, one output providing a signal containing information about the phase of the signal received at its input, and the other output providing a signal having an amplitude proportional to the logarithm of the amplitude of the signal received at its input. The outputs of the logarithmic amplifiers 201, 202 which provide signals containing phase information are connected to respective ones of the inputs of the phase comparator 109. The outputs of the logarithmic amplifiers 201, 202 which provide signals representative of the logarithm of the amplitude of the input signal are connected to respective ones of the inputs of the comparator 111.

In one embodiment, the logarithmic amplifiers 201 and 202 are successive detection logarithmic amplifiers. Such amplifiers have an RF output which is amplitude limited and can be designed to have a constant phase limited output, i.e., the phase of the output signal does not vary with the amplitude of the input signal. Successive detection amplifiers are commonly used in radio receivers for cellular telephony, where the amplitude output is referred to as the Received Signal Strength Indicator (RSSI) output. In radar applications, the amplitude output of a successive detection amplifier is known as the video output. In an alternative embodiment, the logarithmic amplifiers 201, 202 are true logarithmic amplifiers such as that described by Barber and Brown in IEEE Journal of Solid States Circuits, June 1980—"A True Logarithmic Amplifier for Radar I.F. Applications", followed by a respective amplitude detector. A true logarithmic amplifier may include a limiting amplifier and a linear amplifier connected in parallel. In general terms, the amplifiers 201, 202 are such that each provides an output signal which is at least approximately logarithmically related to its input signal, and the term "logarithmic amplifier" herein is to be construed accordingly.

An advantage achieved using the logarithmic amplifiers 201, 202 in the polar loop transmitter 200 is that, for any given difference in amplitude (in dB, i.e., having a given ratio therebetween) between the input 101 and the output 103, the difference voltage representing an error in amplitude is constant within the errors of the logarithmic amplifiers. Accordingly, the degree of error between the correct (ideal) amplitude and the actual amplitude of the modulated input signal provided at the output 103 is not dependent on the amplitude of the signal received at the input 101. Distortion of low input signal levels is thereby reduced. The art of producing matched logarithmic strips for use in logarithmic amplifiers is well known, having been practiced for many years in the field of monopulse radar.

Referring now to FIG. 3, a second polar loop transmitter circuit arrangement 300 is shown, this being a modification of the polar loop transmitter circuit arrangement 200 of FIG. 2. The polar loop transmitter 300 further comprises in-phase and quadrature modulation inputs 301 and 302. Signals received at the inputs 301, 302 are mixed with, respectively, a signal provided by a local oscillator 303 in a first balanced modulator 304, and a version of the local oscillator signal, shifted by a 90° phase shifter 305, in a second balanced modulator 306. In-phase and quadrature local oscillator signals may be provided instead through the use of a different phase shift network, such as one including a+45° phase shifter and a−45° phase shifter. Outputs of the balanced modulators 304 and 306 are provided to a combiner 307, which combines the signals received at its inputs, and provides the result via the input 101 to the first logarithmic amplifier 201.

A mixer 308 is connected between the RF output 103 of the transmitter and the input of the second logarithmic amplifier 202. The mixer 308 receives a signal provided by a frequency determining source 309, which may be a frequency synthesizer. The frequency of operation of the frequency determining source is selected such that signals of the output of the mixer 308 are of the same nominal frequency as signals at the input 101. This allows the output frequency to differ from the input frequency, and also reduces the negative effects of spurious signals, including signal intermodulation products.

In one embodiment, the mixer 308 is a conventional mixer and filtering is provided to remove or to reduce the image frequency signals generated by the mixer. This filtering may be provided by frequency roll-off in the mixer 308, by frequency roll-off in the logarithmic amplifier 202, or by a discrete filter (not shown) connected between the mixer 308 and the logarithmic amplifier 202. In an alternative embodiment, the mixer 308 is an image-reject mixer, as shown in FIG. 3.

The polar loop transmitter 300 as described above may be modified by the provision of a comparator 111 having a third input, and by the connection of an output of a power control device 310 to this third input. This is shown in dotted lines in FIG. 3. The amplitude of a signal provided to the comparator 111 by the power control device 310 determines the power of signals provided at the output 103. This constitutes a particularly convenient scheme for effecting power control. When the polar loop transmitter 300 is used in a time division multiple access (TDMA) or similar system, the power control device 310 effects shaping (i.e., rounding) of the rise and fall of the power of the signal provided at the output 103 to reduce the effects of 'splatter' or 'key clicks', which are produced by sharp edged radio frequency (RF) envelopes.

A polar loop transmitter in accordance with this invention has potential applications in many fields, including cellular radio. Where transmitters of minimum power consumption are required, and complexity and cost constraints are such that minimum geometry semiconductor fabrication techniques are desirable, certain difficulties arise even when small amounts of RF power are required. Difficulties can arise when only low voltage supplies are allowable, since this can require the use of low impedances. Similarly, because of these constraints, it is desirable to minimize the number of external filters, but system requirements can place significant constraints on the wideband noise that can be produced. In turn, this leads to a requirement to maximize signal voltages, which can be incompatible with the allowable supply voltage of the semiconductor fabrication technique. The polar loop transmitter of the invention allows a large proportion of the circuitry to be implemented in minimum geometry low supply voltage techniques. Additionally, the output amplifier 104, although shown as a modulated amplifier, could be a modulating stage followed by an amplifier. Such an amplifier could be a high efficiency amplifier operating in Class E, with the distortion products resulting from the use of non-constant envelope signals reduced by means of the amplitude feedback inherent in the system.

This invention can be implemented optically by substituting the oscillator 102 with a frequency modulated light source, such as a laser, and by substituting the controllable gain amplifier 104 with a device whose light transmissibility is proportional to an applied voltage, such as a Kerr cell. In this case, the image reject mixer 308 would be replaced with a photodetector fed by a further laser.

While at least one presently preferred embodiment of the invention has been described using specific terms, such description is for illustrative purposes only, and it is to be understood that changes and variations may be made without departing from the spirit or scope of the following claims.

What is claimed is:

1. A polar loop transmitter circuit arrangement comprising:
   - a circuit input;
   - a circuit output;
   - a controllable signal source;
   - a comparator having first and second inputs and an output;
   - a modulator coupled between the signal source and the circuit output;
   - a first logarithmic amplifier having an input and an output, the input being coupled to the circuit input;
   - a second logarithmic amplifier having an input and an output, the input being coupled to the circuit output; and
   - the output of each logarithmic amplifier being coupled to respective inputs of the comparator, and the output of the comparator being coupled to an input of the modulator.

2. A polar loop transmitter circuit arrangement as claimed in claim 1, further comprising a mixer connected between the circuit output and the input of the second logarithmic amplifier.

3. A polar loop transmitter circuit arrangement as claimed in claim 2, further comprising means to suppress an image frequency signal generated by the mixer.

4. A polar loop transmitter circuit arrangement as claimed in claim 2, in which the mixer is an image-reject mixer.

5. A polar loop transmitter circuit arrangement as claimed in claim 1, in which the first and second logarithmic amplifiers are successive detection logarithmic amplifiers.

6. A polar loop transmitter circuit arrangement comprising:
   - a circuit input;
   - a circuit output;
   - a controllable signal source;
   - a comparator having first and second inputs and an output;
   - a modulator coupled between the signal source and the circuit output;
   - a first logarithmic amplifier having an input and an output, the input being coupled to the circuit input;
   - a second logarithmic amplifier having an input and an output, the input being coupled to the circuit output;
   - the output of each logarithmic amplifier being coupled to respective inputs of the comparator, and the output of the comparator being coupled to an input of the modulator; and
   - in which the first and second logarithmic amplifiers are true logarithmic amplifiers succeeded by amplitude detectors.

7. A polar loop transmitter circuit arrangement comprising:
   - a circuit input;
   - a circuit output;
   - a controllable signal source;
   - a comparator having first and second inputs and an output;
   - a modulator coupled between the signal source and the circuit output;
   - a first logarithmic amplifier having an input and an output, the input being coupled to the circuit input;
   - a second logarithmic amplifier having an input and an output, the input being coupled to the circuit output;
   - the output of each logarithmic amplifier being coupled to respective inputs of the comparator, and the output of the comparator being coupled to an input of the modulator: and
   - a power control device having an output and wherein the comparator has a third input connected to the output of the power control device.

8. A polar loop transmitter circuit arrangement as claimed in claim 7, wherein when used in a TDMA type system the power control device is arranged to shape the rise and fall of a signal, whereby to reduce 'splatter' or 'key clicks'.

* * * * *